United States Patent [19]

Myer

[11] Patent Number: 4,885,551

[45] Date of Patent: Dec. 5, 1989

[54] FEED FORWARD LINEAR AMPLIFIER

[75] Inventor: Robert E. Myer, Denville, N.J.

[73] Assignee: American Telephone and Telegraph Company AT&T Bell Laboratories, Murray Hill, N.J.

[21] Appl. No.: 265,084

[22] Filed: Oct. 31, 1988

[51] Int. Cl.⁴ .............................................. H03F 1/32
[52] U.S. Cl. ...................................... 330/52; 330/151
[58] Field of Search .......................... 330/52, 151, 149

[56] References Cited

U.S. PATENT DOCUMENTS

| | | | |
|---|---|---|---|
| 3,886,470 | 5/1975 | O'Neil et al. | 330/149 |
| 3,922,617 | 11/1975 | Denniston et al. | 330/151 X |
| 4,389,618 | 6/1983 | Bauman | 330/151 X |
| 4,394,624 | 7/1983 | Bauman | 330/151 |
| 4,412,185 | 10/1983 | Gerard | 330/151 |
| 4,580,105 | 4/1986 | Myer | 330/149 |

FOREIGN PATENT DOCUMENTS 2107540 4/1983 United Kingdom ................ 330/149

Primary Examiner—James B. Mullins
Attorney, Agent, or Firm—Jack S. Cubert

[57] ABSTRACT

A feed forward circuit receives an input signal having at least one carrier therein in a prescribed frequency range. The input signal is applied to a first circuit path having a power amplifier that produces an output signal with a distortion component and to a second circuit path that delays the input signal without distortion. The output signal of the first circuit path is combined with the output signal of the second circuit path to form a signal representative of the distortion component of the first circuit path output signal and the distortion component representative signal is subtracted from the output signal of the first circuit path to cancel the distortion component therein. The prescribed frequency range of the first circuit path output is scanned to detect a carrier signal and the amplitude and phase of the signal in the first circuit path is modified to minimize the magnitude of the detected carrier in the distortion representative signal.

20 Claims, 11 Drawing Sheets

FEED FORWARD LINEAR AMPLIFIER

FIELD OF THE INVENTION

This invention relates to high power linear amplifiers and more particularly to automatic control systems employing feed forward to reduce distortion of high power linear amplifiers.

BACKGROUND OF THE INVENTION

RF linear amplifiers utilize devices that exhibit non-linear characteristics at higher power levels whereby signal distortion is introduced. If more than one signal is applied to a linear amplifier, its non-linear characteristics cause an unwanted multiplicative interaction of the signals being amplified and the amplifier output contains intermodulation products. These intermodulation products cause interference and crosstalk over the amplifier frequency operating range which interference may exceed established transmission standards.

As is well known, intermodulation distortion can be reduced by negative feedback of the distortion components, predistortion of the signal to be amplified to cancel the amplifier generated distortion or by separating the distortion component of the amplifier output and feeding forward the distortion component to cancel the distortion in the amplifier output signal. Of these techniques, the forward feed approach provides the most improvement. Forward feed, however, is the most difficult to apply since it requires modifying the separated distortion component in amplitude and phase to match the gain and phase shift of the amplifier on a continuous basis.

U.S. Pat. No. 3,886,470 issued to O'Neil et al May 27, 1975 discloses a forward feed amplifier system in which an amplified signal from a main amplifier is compared with a time delayed unamplified signal to isolated the noise and distortion components produced by the main amplifier. The isolated distortion and noise components are then amplified in an auxiliary amplifier and combined with the signal amplified in the main amplifier to cancel the error caused by main amplifier distortion. In such a system, it is necessary to adjust the delay and amplitude of the unamplified signal to obtain complete isolation of the distortion and noise components from the main amplifier and to control the phase and gain of the auxiliary amplifier to achieve adequate error cancellation. Such adjustments are difficult to make automatically.

U.S. Pat. No. 4,580,105 issued to Robert E. Myer Apr. 1, 1986 discloses an arrangement for automatic reduction of intermodulation products in high power linear amplifiers wherein a distortion simulating pilot at a preset frequency is injected at the input of an amplifier which uses feed forward distortion correction. The magnitude of the pilot signal in the amplifier output is used to control a decreasing step size controller to adjust the gain and phase of the feed forward distortion signal. In this way, both the pilot signal and the distortion introduced by the amplifier are removed. While the injected pilot permits a high degree of automatic control, it occupies a portion of the amplifier band that could otherwise be employed to carry an information bearing signal and reduces the frequency usage efficiency. It is an object of the invention to provide an improved feed forward amplifier arrangement with automatic reduction of distortion without affecting frequency usage efficiency.

SUMMARY OF THE INVENTION

The invention is directed to a feed forward circuit which receives an input signal having at least one carrier therein in a prescribed frequency range. The input signal is applied to a first circuit path that includes a power amplifier to generate an output signal having a distortion component and to a second circuit path that includes delay means for transferring the input signal without distortion. The output signal of the first circuit path is combined with the output signal of the second circuit path to form a signal representative of the distortion component of the first circuit path output signal. The signal representative of the distortion component is subtracted from output signal of the first circuit path to cancel the distortion component in the first circuit path output. The combining of the outputs of the first and second circuit paths is controlled by detecting an existing carrier signal in the prescribed frequency range, and modifying the amplitude and phase of one of the first and second circuit paths to reduce the magnitude of the detected carrier signal from the combining means.

According to one aspect of the invention, the frequency spectrum of the amplifier output signal is scanned to detect a frequency at which there is an existing carrier. The magnitude of the detected carrier is used to control the adjustment of the magnitude and phase of the main amplifier path signal whereby the gain of the main amplifier path is stabilized.

According to another aspect of the invention, the frequency spectrum of the amplifier output signal is scanned to detect a frequency at which there is no signal and a pilot signal at the detected frequency is coupled to the first and second circuit paths. The pilot signal component of the combined outputs of the first and second circuit paths is used to control the magnitude and phase adjustment.

DETAILED DESCRIPTION

Figure 1:
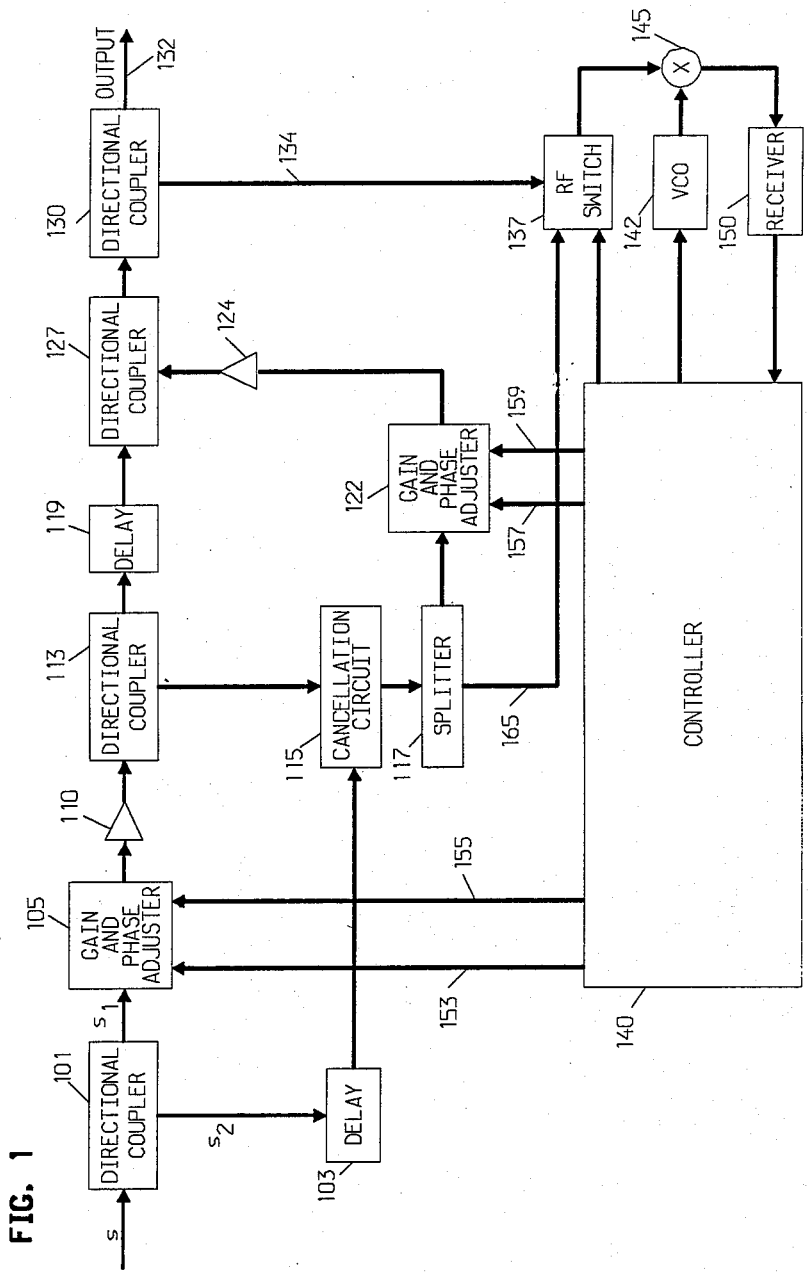
FIG. 1 shows a general block diagram of an amplifier using a carrier signal for forward feed distortion correction that is illustrative of the invention.

FIG. 1 depicts a forward feed amplifier illustrative of the invention that is operative to amplify signals across a prescribed frequency band. Referring to FIG. 1, a composite input signal which may comprise a plurality of signals across the prescribed band is divided into two portions $s_1$ and $s_2$ by directional coupler 101. The amplitude and phase of signal $s_1$ is modified in amplitude and phase adjuster 105, amplified in main amplifier 110, and directed to the output 132 through directional coupler 113, delay 119, directional couplers 127 and 130. Distortion and intermodulation product components may be added by power amplifier 110 as aforementioned which distortion must be removed from the signal appearing at output 132.

Signal $s_2$ is delayed in delay circuit 103 and applied to one input of cancellation circuit 115 without any distortion being introduced. Directional coupler 113 splits the signal from power amplifier 110 and supplies a portion of the power amplifier output to the other input of cancellation circuit 115. The signal from directional coupler 113 has a distortion and intermodulation product component but the signal from delay 103 is clean i.e., substantially free of any distortion. The clean signal from delay 103 is subtracted from the distorted amplifier output signal in cancellation circuit 115. If the amplitude and phase of the power amplifier input is properly adjusted, the amplified signal from directional coupler 113 is cancelled by the clean signal from delay 103. As a result, only the distortion and intermodulation component D appears at the cancellation circuit output.

A portion of the distortion component D from cancellation circuit 115 is passed through signal splitter 117, amplitude and phase adjuster 122 and correction amplifier 124 into directional coupler 127 wherein it is subtracted from the output of the power amplifier applied via directional coupler 113 and delay 119. The time delay of delay 119 is set to compensate for the signal delay through the path including signal splitter 117, amplitude and phase adjuster 122 and auxiliary amplifier 124. Consequently, the output signal from directional coupler 127 has all or a substantial portion of the distortion from the power amplifier removed.

Figure 7:
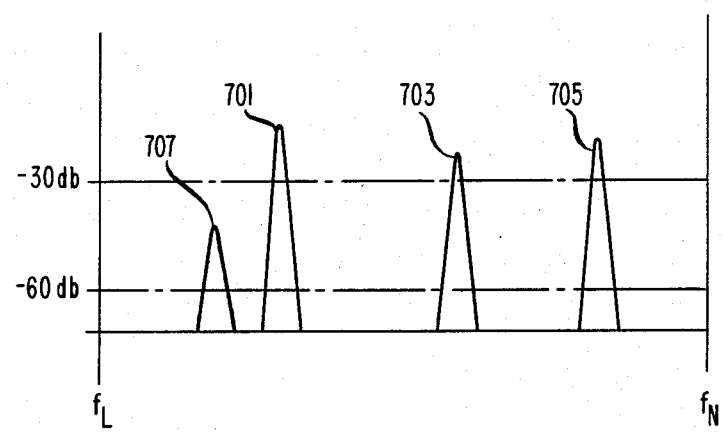
FIG. 7 shows waveforms illustrating the operation of the circuit of FIG. 1 in the amplifier frequency spectrum.

In order to assure maximum distortion removal, the distortion signal must be measured and amplitude and phase adjusters controlled to reduce the distortion. FIG. 7 illustrates the frequency band of the circuit of FIG. 1. Carrier signals shown in waveforms 701, 703 and 705 have amplitudes greater than $-30$ db and an intermodulation distortion product signal 707 has an amplitude between $-30$ and $-60$ db. In accordance with the invention, controller 140 is operative to scan output 132 from one end, e.g., $f_L$, of the prescribed frequency band of the circuit of FIG. 1 to locate carrier signal $S_c$ (waveform 701). Once the carrier signal is located, the magnitude of the carrier signal from cancellation circuit 115 is supplied to the controller via narrow band receiver 150 and the amplitude and phase parameters of amplitude and phase corrector 105 are iteratively modified by the controller to drive the carrier signal component of the output of the cancellation circuit to a minimum. This amplitude and phase adjustment assures that output of the cancellation circuit has the maximum carrier signal reduction. It is also necessary to minimize the intermodulation product component of the power amplifier output. In accordance with the invention, the prescribed frequency band is again scanned from end $f_L$ in FIG. 7 to detect the intermodulation product signal of waveform 707. Once the intermodulation product signal is found, the parameters of amplitude and phase adjuster 122 are iteratively modified by controller 140 to minimize the intermodulation product signal appearing on lead 134 from directional coupler 130. Advantageously, it is not necessary to remove a portion of the prescribed frequency band from service in order to insert a pilot signal for distortion reduction.

Figure 3:
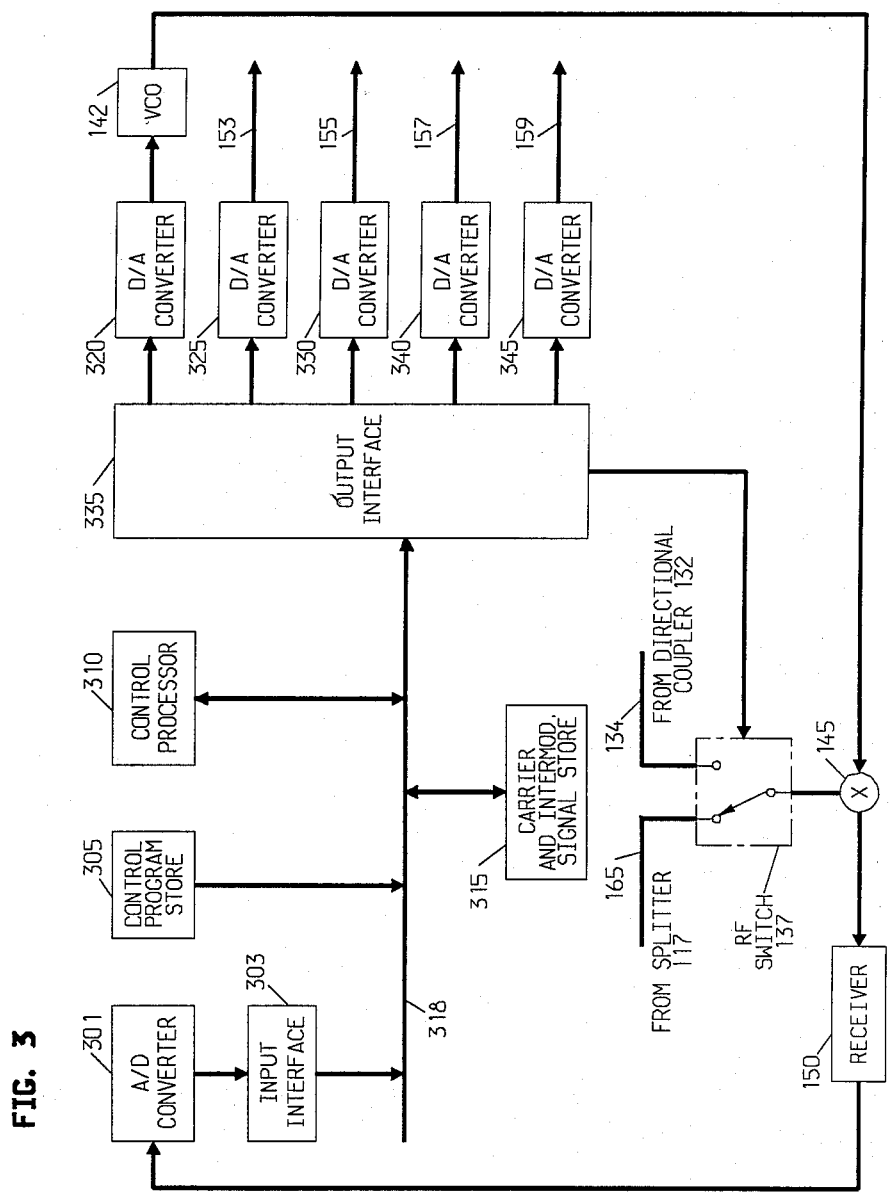
FIG. 3 shows a more detailed diagram of the controller used in the circuit of FIG. 1.

Controller 140 is shown in greater detail in FIG. 3. The circuit of FIG. 3 comprises a signal processor arrangement such as the Intel type D87C51 microprocessor and includes control program store 305, control processor 310, carrier and intermodulation signal store 315, input interface 303, output interface 335 and bus 318. Analog to digital converter 301 receives signals representative of the magnitude of signals from receiver 150 and converts the analog signal into a series of digital values. Control processor 310 operating in accordance with instructions stored in control program store 305 causes these digital values to be sent to store 315 via input interface 303 and bus 318. The processor also provides digital signals to digital to analog converters 320, 325, 330, 340 and 345 via bus 318 and output interface 335. The analog output of converter 320 is supplied to voltage controlled oscillator (VCO) 142 to direct scanning operations. The outputs of converters 325 and 330 are sent to the amplitude adjustment control and the phase adjustment control of amplitude and phase adjuster 105 via leads 153 and 155 to modify the adjuster's amplitude and phase characteristics, respectively. The outputs of converters 340 and 345 are sent to amplitude and phase adjuster 122 via leads 157 and 159 to modify its amplitude and phase parameters. Interface 335 is also connected to the control lead of RF switch 137 to determine its position during the control operations.

Prior to the start of operation of the circuit of FIG. 1, amplitude and phase adjusters 105 and 122 are manually trimmed to optimum settings. Controller 140 is adapted to maintain optimum operation over time under varying conditions. Amplitude and phase adjuster 105 modifies the amplitude and phase characteristics of the circuit path including power amplifier 110 so that the amplifier output signal is cancelled by the undistorted input signal from delay 103. Controller 140 is first connected to directional coupler 130 by RF switch 137 and directs the scanning the frequency spectrum of the signal therefrom through VCO 142, mixer 145 and narrow band receiver 150 in FIG. 1 to detect a carrier. It is then connected to splitter 117 at the output of cancellation circuit 115 and the amplitude and phase parameters of adjuster 105 are adjusted to minimize the magnitude of the carrier appearing on lead 165. After the carrier component is minimized or a preset number of adjustments are made, the controller operates to scan the prescribed frequency band from end $f_L$ on lead 134 to detect an intermodulation signal and makes a sequence of adjustments of the amplitude and phase parameters of adjuster 122 to reduce the intermodulation signal on lead 134 below a prescribed threshold. The controller continuously cycles through parameter adjustment of amplitude and phase adjusters 105 and 122.

Figure 4:
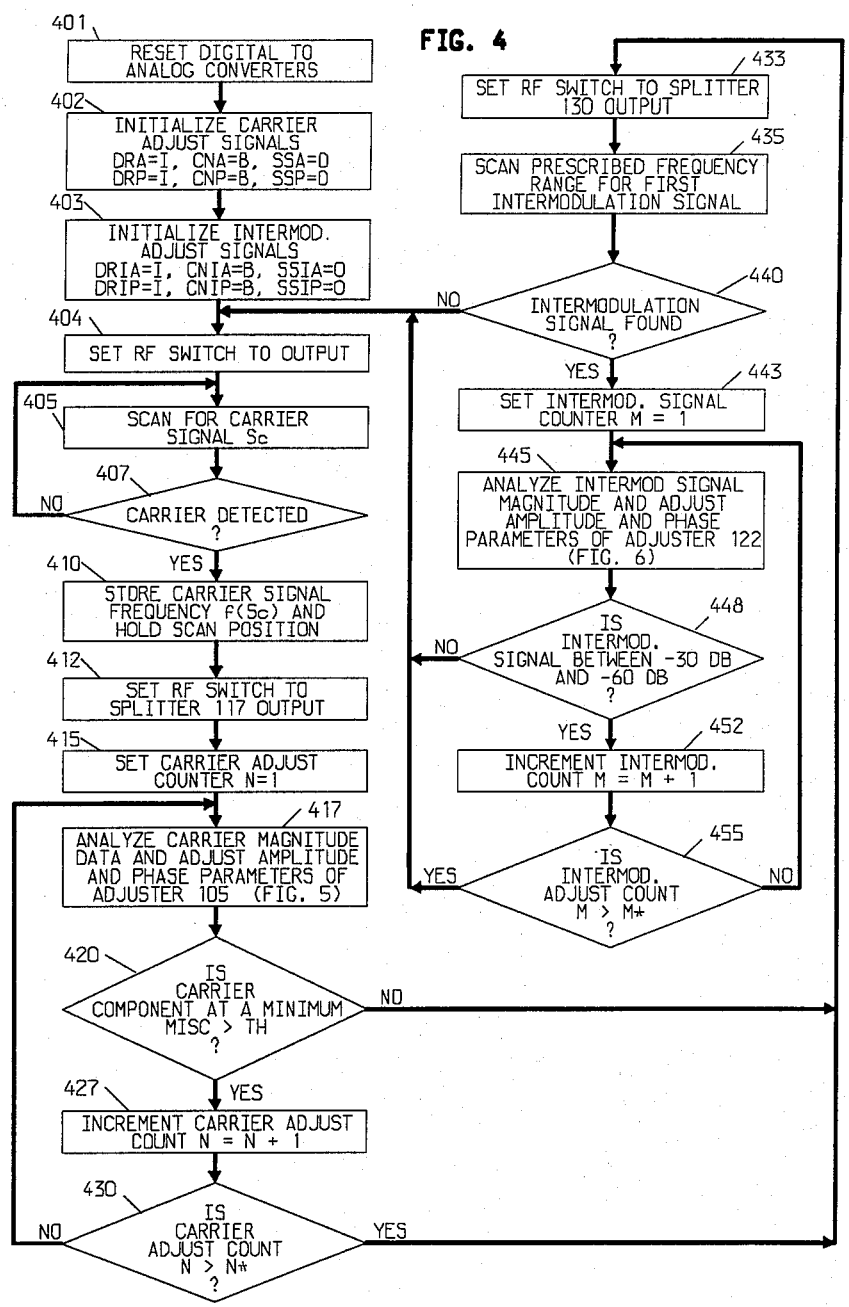
FIGS. 4, 5 and 6 are flow charts illustrating the operation of the controller for the amplifier of FIG. 1.

The operation of the controller of FIG. 3 is directed by instructions permanently stored in control program store 305. FIG. 4 is a flow chart illustrating the operation of the controller 140 in accordance with the instructions stored therein. With reference to FIGS. 3 and 4, control processor 310 initially resets digital a analog converters 320, 325, 330, 340 and 345 as per program step 401. Carrier adjustment control signals and the intermodulation adjustment control signals are then initialized in steps 402 and 403 and RF switch 137 is set to receive the signal on lead 134 (step 404). At this time, VCO circuit 142 is set by digital to analog converter 320 to be at the $f_L$ end of the prescribed frequency range of the amplifier. RF switch 137 is set to couple lead 134 to one input of mixer 145 and VCO 142 is coupled to the other input of mixer 145. In the loop from step 405 to step 407, the prescribed frequency band is scanned (step 405) until a carrier signal is detected at lead 134 (step 407). Signals obtained at narrow band receiver 150 during the scan are applied to analog to digital converter 301 in FIG. 3 and stored by the control processor in data store 315. Upon detection of a carrier signal by the control processor, the carrier signal amplitude and frequency are stored and the scan frequency of VCO 142 is maintained (step 410).

Processor 310 sends a signal to RF Switch 137 to change its position to couple the distortion signal from splitter 117 to mixer 145 (step 412). At this time, the signal on lead 165 corresponding to the detected carrier is applied from receiver 150 to analog to digital converter 301. A signal N which counts the number of carrier signal adjustments is then set to one (step 415) and the carrier signal adjustment loop from step 417 to step 430 is entered. During the iterative detected carrier signal adjustment, the parameters of amplitude and phase adjuster 105 are modified to minimize the carrier signal observed by the control processor. The loop is iterated until the carrier signal falls below a predetermined threshold or until a preset number of adjustments have been made.

In the carrier adjustment loop, the carrier signal at splitter 117 is applied to analog to digital converter 301 via RF switch 137, mixer 145 and receiver 150. The carrier magnitude data is analyzed and adjustments are made to the amplitude and phase parameters of adjuster 105 (step 417). The magnitude of the carrier signal $M(S_c)$ is compared to the predetermined threshold in decision step 420 by processor 310. Until the carrier magnitude is less than the threshold TH, the loop is iterated. In each iteration, the magnitude of the carrier signal from splitter 117 is compared to a threshold value (step 420). If the magnitude of the carrier signal at splitter 117 is less than the threshold value, e.g., $-30$ db, the carrier component in the output of cancellation circuit 115 in FIG. 1 is determined to be acceptable, control is passed to step 433 and the intermodulation signal reduction is started. Where the magnitude is equal to or greater than the threshold value TH, the carrier adjustment count is incremented (step 427) and compared to a predetermined number N* (step 430). If N* is exceeded, the iterations are terminated and the intermodulation product signal reduction is begun in step 433. The operations of data analysis step 417 are shown in greater detail in the flow chart of FIG. 5.

Figure 5:
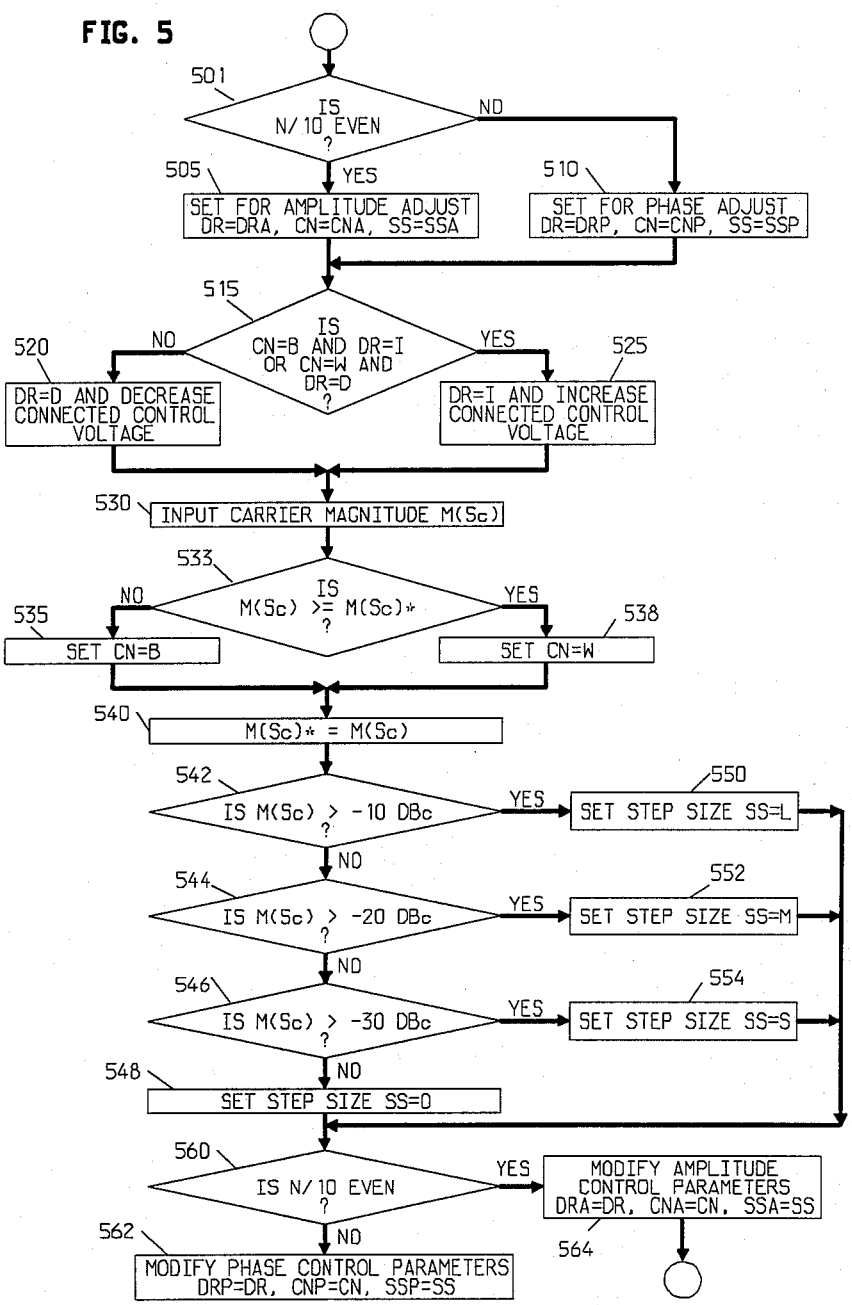

With reference to FIG. 5, the analysis involves separate adjustment of the amplitude and phase parameters of adjuster 105. Decision step 501 is entered from step 415 or step 430 to determine whether the amplitude or the phase parameter is to be adjusted in the current iteration. This is done by dividing the adjustment count signal N by 10. If the result is even, the control signals DR, CN and SS are set to the amplitude adjustment values DRA, CNA and SSA in step 505. Otherwise the adjustment control signals DR, CN and SS are set to DRP, CNP and SSP for phase adjustment in step 510. Assume for purposes of illustration that amplitude adjustment is selected. The direction of change control signal DR is initially set to the value, i.e., I (increase) or D (decrease), obtained in the last iteration. The condition control signal is set to either B (better) or W (worse) corresponding the corrective value of the last iteration and the correction step size SS is set to a large value, medium value or small value corresponding to the last iteration.

Decision step 515 is then entered in which the control parameters are evaluated. If CN=B and DR=I or CN=W and DR=D indicating an improvement on increase or a worsening on decrease during the last iteration, control signal DR is set to I and the control voltage on amplitude adjustment digital to analog converter 325 is increased by an amount corresponding to the setting of step size signal SS (step 525). In the event that the condition CN=B and DR=I or CN=W and DR=D is not satisfied, direction control DR is set to D and the control voltage on the amplitude adjustment converter is decreased by the amount corresponding to the last iteration step size SS (step 520). In the initial iteration, the step size is preset to zero.

After the adjustment of step 520 or step 525, the carrier detected signal amplitude M(Sc) is input from receiver 150 of FIG. 1 (step 530) and compared to the amplitude of the preceding iteration M(Sc)* (step 533). If M(Sc)≧M(Sc)*, the adjustment status is worse and condition signal CN is set to W (step 538). Where M(Sc) is smaller than M(Sc)*, the adjustment status is better and CN is set to B (step 535). M(Sc)* is then set to the current magnitude value M(Sc) in step 540 preparatory for the next iteration.

The range of the present magnitude signal M(Sc) is then determined in decision steps 542, 544 and 546 so that the step size of the next iteration can be adjusted. If the magnitude of M(Sc) is greater than $-10$ db relative to the peak of the detected carrier, the step size is set to a large value in step 550 so that the next adjustment provides a large correction. A magnitude of M(Sc) between $-10$ and $-20$ db causes the step size to be set to a medium value in step 552 and a step size between $-20$ and $-30$ db generates a small step size in step 554. If the magnitude of M(Sc) is less than $-30$ db, the step size is set to zero in step 548. Since N/10 is even for amplitude adjustment, step 564 is entered via decision step 560 and the updated parameters, DR, CN and SS are stored as signals DRA, CNA and SSA. If N/10 is odd, control parameters DR, CN and SS are stored as signals DRP, CNP and SSP in step 562. Processor control is then passed to step 420 in FIG. 4.

Where the signal N/10 is odd, the operation of the control processor is the same as previously described with respect to FIG. 5 except that condition control signal CNP, direction control signal DRP and step size signal SSP are obtained as indicated in step 510 and used as control signals CN, DR and SS. Maximum adjustment count signal N* may be set to a high value, e.g., 10 so that the control processor adjusts one of the amplitude and phase parameters of adjuster 105 ten times and then adjusts the other of the amplitude and phase parameters 10 times or until the magnitude of the carrier signal M(Sc) falls below threshold TH.

When the carrier processing loop of FIG. 4 is exited via decision step 420 or 430, processor 310 causes RF switch 137 to be repositioned so that lead 134 from directional coupler 130 is connected to one input of mixer 145 and the output of receiver 150 corresponds to the output signal at lead 134 (step 433). The controller is then conditioned to scan the frequency range of the amplifier from the same end used as the starting frequency of the carrier signal to search for an intermodulation product signal, e.g., signal between $-30$ db and −60 db (step 435). If such an intermodulation product signal is detected in step 440, the intermodulation count signal M is set to one (step 443) and intermodulation adjustment loop from step 445 to step 455 is entered. Otherwise, the processor returns to step 404 so that the carrier scan process of steps 405 and 407 is restarted.

In the intermodulation reduction loop, processor 310 analyzes the intermodulation signal magnitude IM and adjusts the amplitude and phase of adjuster 122 responsive thereto (step 445). After an adjustment is made to adjuster 122, the intermodulation signal IM is tested in decision step 448. If the magnitude IM is not between −30 and −60 db, processor control is passed to step 404 and the carrier signal search loop is reentered. When the IM signal is between −30 and −60 db, another iteration of the intermodulation reduction loop is needed and intermodulation count signal M is incremented (step 452). The incremented value is compared to maximum count signal M* (step 455) and the loop is reentered in step 445. If the magnitude IM is greater than −30 db, the detected signal may not be an intermodulation signal and control is returned to step 404. Where IM is below −60 db, the value is acceptable and step 404 is reentered. The intermodulation reduction loop may be exited from either decision steps 448 or 455.

Figure 6:
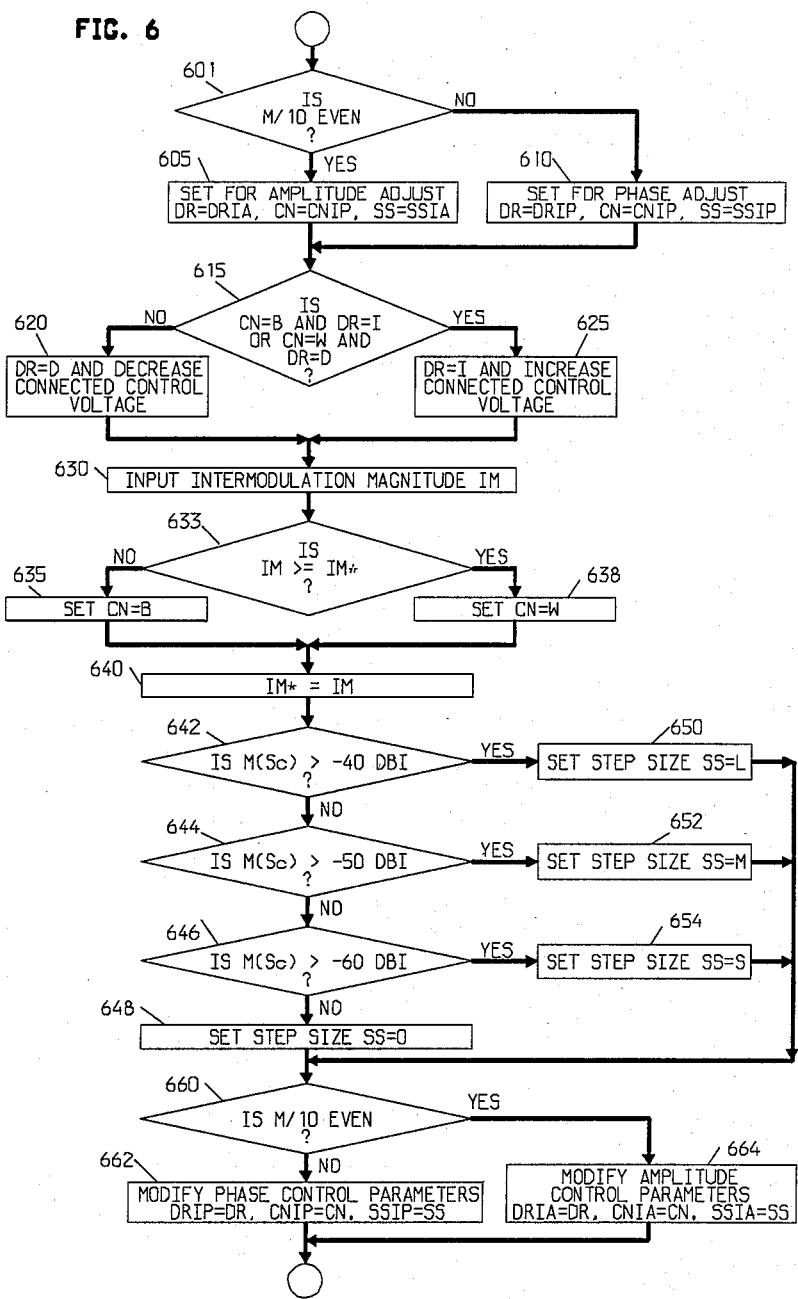

The intermodulation signal analysis and adjustment step 445 is shown in greater detail in FIG. 6. Referring to FIG. 6, the analysis involves separate adjustment of the amplitude and phase parameters of adjuster 122. Decision step 601 is entered from step 443 or 455 in FIG. 4 to determine whether the amplitude or the phase parameter is to be adjusted in the current iteration. This is done by dividing the adjustment count signal M by 10. If the result is even, the control signals for the adjustments DR, CN, and SS are set to previous intermodulation values DRIA, CNIA and SSIA in step 605. Otherwise the adjustment control signals DR, CN, and SS are set to previous intermodulation values DRIP, CNIP and SSIP in step 610. Assume for purposes of illustration that amplitude adjustment is selected. The direction of change control signal DR is initially set to the value, i.e., I (increase) or D (decrease), obtained in the last iteration. The condition control signal is set to either B (better) or W (worse) corresponding the corrective value of the last iteration and the correction step size SS is set to a large value, medium value or small value corresponding to the last iteration.

Decision step 615 is then entered wherein the control parameters are evaluated. If CN=B and DR=I or CN=W and DR=D indicating an improvement on increase or a worsening on decrease during the last iteration, control signal DR is set to I and the control voltage on amplitude adjustment digital to analog converter 340 is increased by an amount corresponding to the setting of step size signal SS (step 625). In the event that the condition CN=B and DR=I or CN=W and DR=D is not satisfied, direction control DR is set to D and the control voltage on the amplitude adjustment converter is decreased by the amount corresponding to the last iteration step size SS (step 620). In the initial iteration, the step size is preset to zero.

After the adjustment of step 620 or step 625, the intermodulation signal amplitude IM is input from receiver 150 of FIG. 1 (step 630) and compared to the amplitude of the preceding iteration IM* (step 633). If IM≧IM*, the adjustment status is worse and condition signal CN is set to W (step 638). Where IM is smaller than IM*, the adjustment status is better and CN is set to B (step 635). IM* is then set to the current magnitude value IM in step 640 preparatory for the next iteration.

The range of the present magnitude signal IM is then determined in decision steps 642, 644 and 646 so that the step size of the next iteration can be is adjusted. If the magnitude of IM is greater than −40 db relative to the peak of the detected carrier the step size is set to a large value in step 650 and the next adjustment provides a large correction. A magnitude of IM between −40 and −50 db causes the step size to be set to a medium value in step 652 and a step size between −50 and −60 db generates a small step size in step 654. If the magnitude of IM is less than −60 db, the step size is set to zero in step 648. Since M/10 is even for amplitude adjustment, step 664 is entered via decision step 660 and the updated parameters DR, CN and SS stored as signals DRIA, CNIA and SSIA. If M/10 is odd, control parameters DR, CN and SS are stored as signals DRIP, CNIP and SSIP in step 662. Processor control is then passed to step 448 in FIG. 4.

Where the signal M/10 is odd, the operation of the control processor is the same as previously described with respect to FIG. 6 except that condition control signal CNIP, direction control signal DRIP and step size signal SSIP are obtained as indicated in step 610 and used as control signals CN, DR and SS. Maximum adjustment count signal M* may be set to a value such as 10 so that the control processor adjusts one of the amplitude and phase parameters of adjuster 105 ten times and then adjusts the other of the amplitude and phase parameters 10 times or until the conditions of step 448 are met.

When the data analysis and comparison of steps 445 and 448 are completed, intermodulation count M is incremented (step 452) and the count is compared to the maximum allowable count M(Sc)* in decision step 455. If M>M*, step 404 is reentered to begin the carrier signal search operations. Where M≦M* in step 455, the next iteration is then started in step 445. The iterations are ended when the intermodulation product signal is outside the −30 to −60 db range set in decision step 448 or the iterations time out in step 455 because count signal M>M*. As a result of the intermodulation reduction loop operation, the intermodulation distortion is reduced by readjusting the parameters of amplitude and phase adjuster 122 until an acceptable level of intermodulation distortion is obtained.

Figure 2:
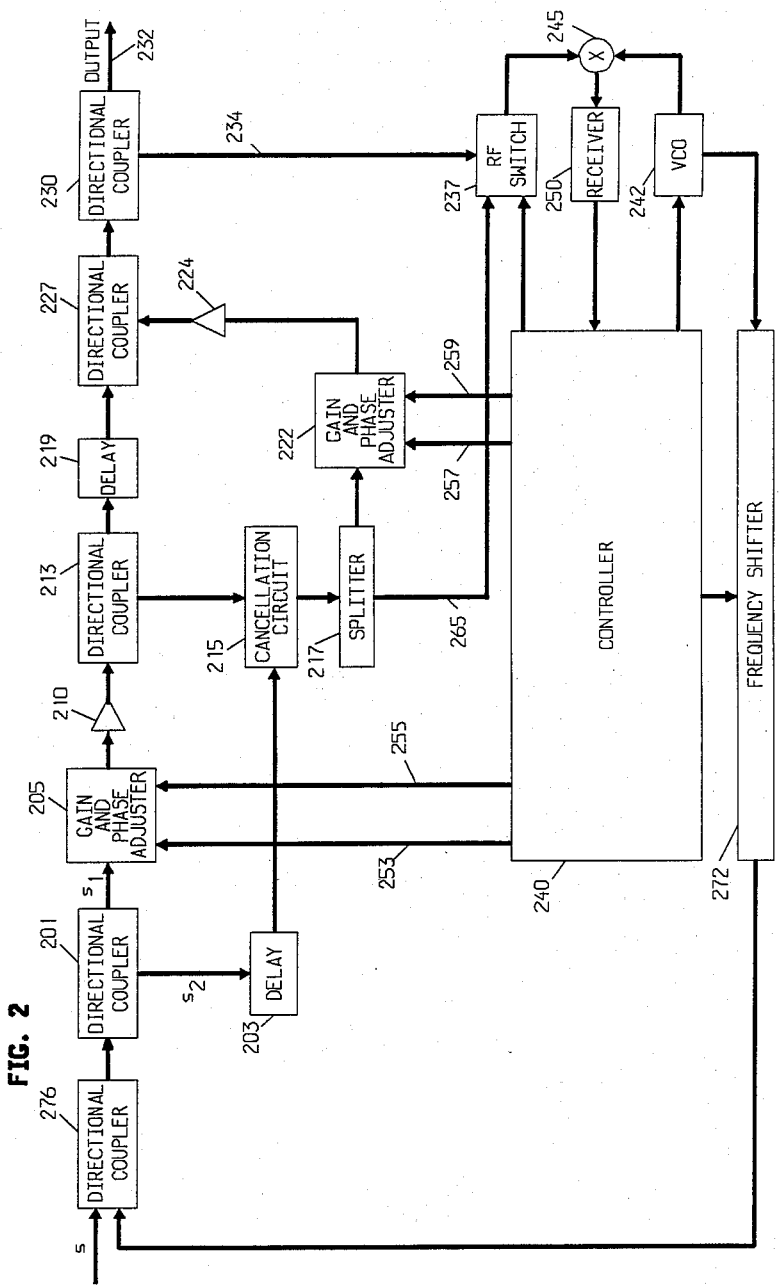
FIG. 2 shows a general block diagram of another amplifier using a pilot signal for forward feed distortion correction that is illustrative of the invention.

FIG. 2 depicts a block diagram of another embodiment illustrative of the invention in which the prescribed frequency range of the amplifier circuit is scanned from end $f_L$ to locate a frequency at which there is no carrier or other signal except noise. Upon detection of a location in the frequency range where only noise is detected, a pilot signal having the detected frequency is introduced into the input of the power amplifier. The pilot operates in the same manner as the detected carrier signal described with respect to FIG. 1 so that the parameters of the main amplifier amplitude and phase adjuster may be modified to minimize the pilot signal and the parameters of the main amplifier amplitude and phase adjuster after the cancellation circuit may be modified to minimize the intermodulation products signal.

Referring to FIG. 2, the power amplifier circuit path includes directional coupler 201, gain and phase adjuster 205, power amplifier 210 and directional coupler 213 which operate as described with respect to FIG. 1.

In addition, directional coupler 276 is inserted before directional coupler 201 so that a pilot signal may be introduced. The input signal delay path comprises delay 203. Cancellation circuit 215 cancels the signal component from the power amplifier path with the delayed input signal from the delay path so that the distortion component appears at the input of splitter 217. Amplitude and phase adjuster 222 modifies the distortion component from the cancellation circuit and applies the modified distortion component to directional coupler 227 via auxiliary amplifier 224. The amplifier output is obtained at lead 232 via directional coupler 230. In FIG. 2, the pilot signal is introduced into both the power amplifier and delay paths and the magnitude of the pilot signal at the output of the cancellation circuit is used to adjust the amplitude and phase parameters of adjuster 205 to keep the pilot signal magnitude at the cancellation circuit output at its minimum value.

Controller 240 is substantially the same as controller 140 of FIG. 1 except that the instructions in control program store 305 are modified to scan the prescribed frequency band from end $f_L$ to locate a frequency at which there is no signal and to insert a pilot signal at that frequency into directional coupler 276. In order to generate a pilot signal, VCO 242 frequency shifter 272 so that it produces a signal at the detected frequency. The inserted pilot then operates as a carrier as described with respect to the flow charts of FIGS. 4 and 5. The operations of FIG. 4 and FIG. 6 with respect to intermodulation product signal reduction are unchanged. Thus rather than scanning for a carrier signal as in steps 405 and 407, the scan steps illustrated in FIG. 8 are performed.

Figure 8:
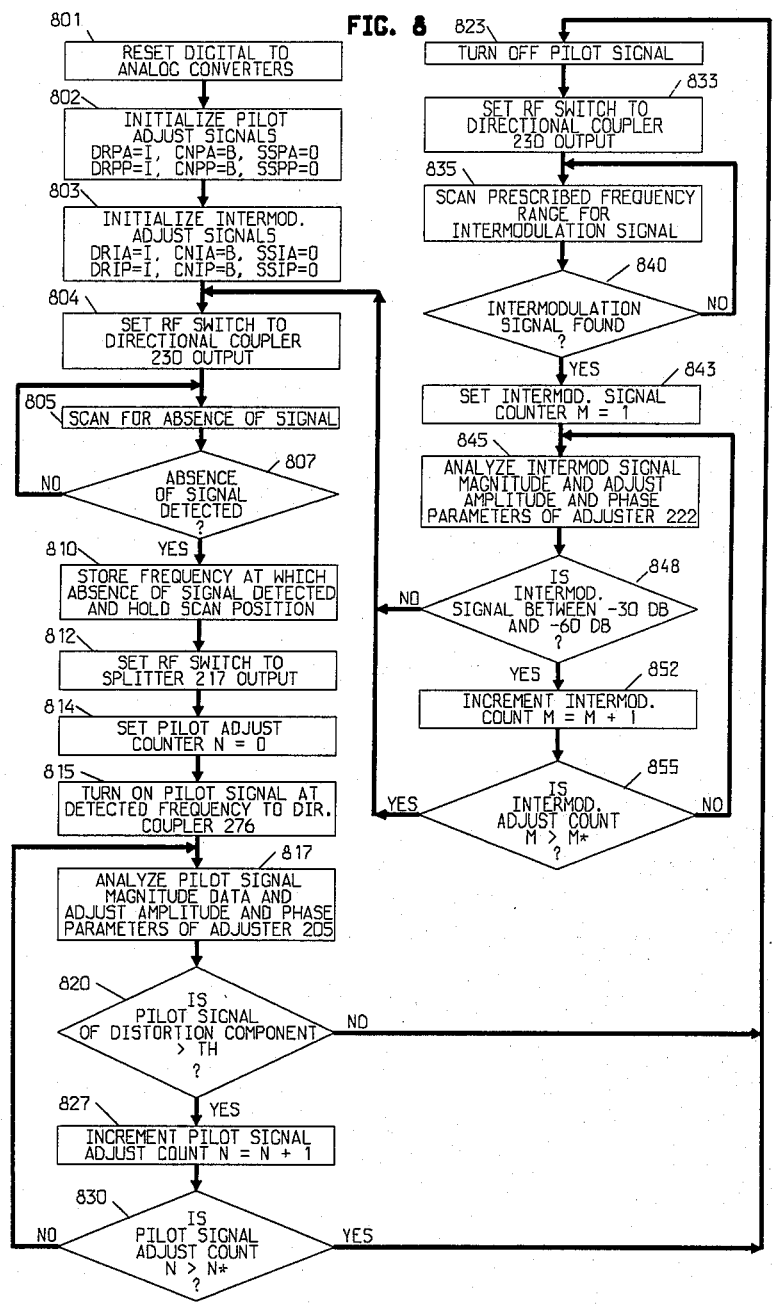
FIG. 8 is a flow chart illustrating the operation of the controller for the amplifier of FIG. 2.

With reference to FIG. 8, digital to analog converters 325, 330, 340 and 345 are initially reset in step 801 and the pilot adjust and intermodulation adjust control signals are initialized in steps 802 and 803. RF switch 237 is then set to couple the signal on lead 234 to mixer 245 (step 804) and controller 240 is directed to scan from one end of the prescribed frequency band for a frequency at which there is no signal (step 805). When the absence of a signal is detected in step 807, the detected frequency is stored (step 810) in data store 315 of FIG. 3. RF switch 237 is then set to connect splitter 217 to mixer 245 (step 812) and the pilot adjust count signal N in the controller processor is reset to zero (step 814). A pilot signal is generated in VCO 242 and converted to the detected frequency in frequency shifter 272. The detected frequency pilot signal is then applied to directional coupler 276 (step 815). The remaining operations of FIG. 8 correspond to the operations with respect to FIG. 1 shown in FIG. 4 except that the magnitude of the pilot signal is analyzed in step 817 of FIG. 8 and FIG. 5 and the pilot signal is turned off (step 823 of FIG. 8). The intermodulation signal reduction in steps 833 through 855 are the same as the corresponding steps in FIG. 4 and FIG. 6 where the intermodulation signal is the first such signal detected in the scan operations of steps 835 and 840. Advantageously, the pilot is inserted at any unused part of the amplifier frequency band and the full frequency band except for the unused pilot frequency may be used for transmission.

Figure 9:
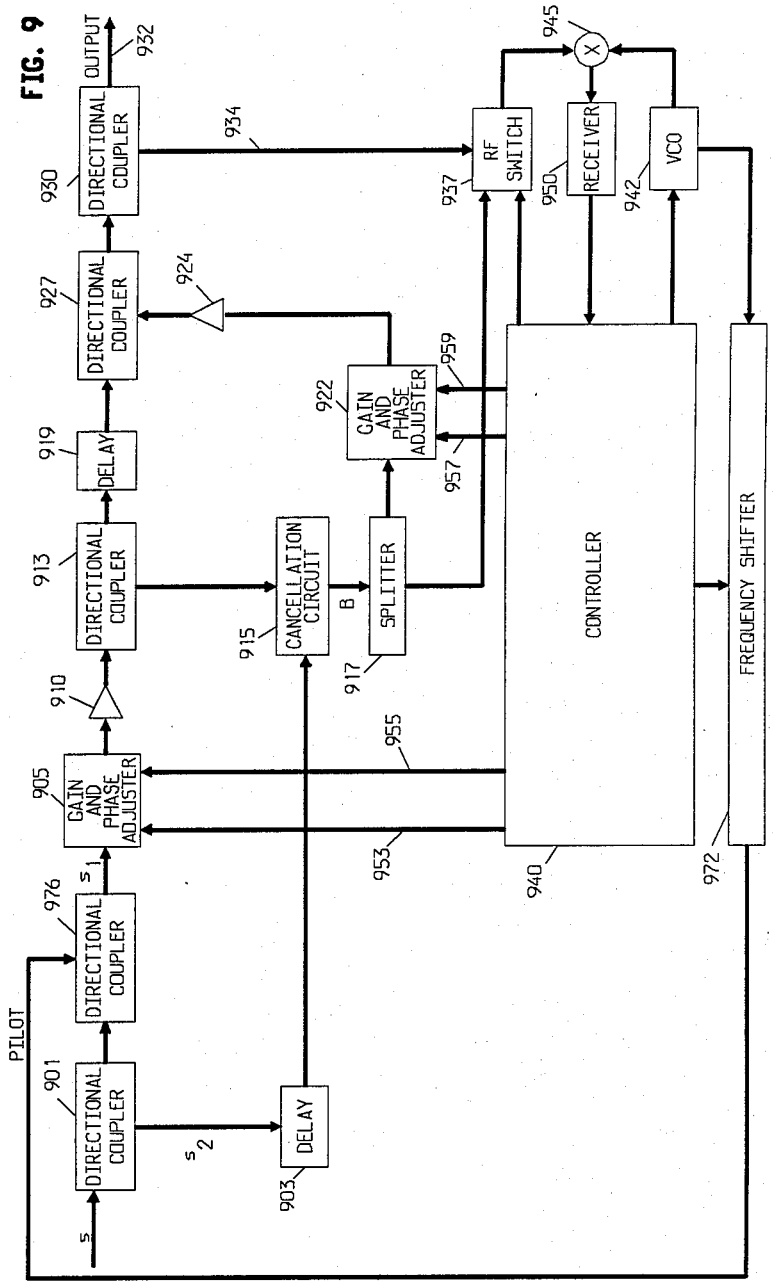
FIG. 9 shows a general block diagram of another amplifier using a pilot signal for intermodulation distortion correction that is illustrative of the invention.

The operation of the amplifier of FIG. 1 in reducing intermodulation products is dependent on the stability of the intermodulation signal used to control amplitude and phase adjuster 122. As is well known in the art, the intermodulation signal produced by a power amplifier may vary considerably. Distortion removal in accordance with the invention may be further improved by using a well-defined pilot signal in place of the detected intermodulation signal to reduce distortion. A modified arrangement to utilize a such a well defined pilot is illustrated in the circuit of FIG. 9 wherein the carrier signal detection and carrier signal minimization is performed as in FIG. 1. The scanning for an intermodulation signal, however, is replaced by a scan for a frequency at which there is no signal. When the absence of a signal is detected, a pilot signal is inserted at that frequency in the power amplifier path, preferably prior to power amplifier 910. Since the pilot is not introduced into the delay path, it is not cancelled in cancellation circuit 915 and is available as part of the distortion component therefrom. The magnitude of pilot signal on lead 934 from directional coupler 930 is applied to controller 940 which sends adjustment signals to gain and phase adjuster 922. When this pilot is reduced to an acceptable level, it is for all practical purposes eliminated from the output and does not interfere with the full use of the prescribed frequency band of the amplifier.

Referring to FIG. 9, the power amplifier circuit path includes directional coupler 901, gain and phase adjuster 905, power amplifier 910 and directional coupler 913 which operate as described with respect to FIG. 1. In addition, directional coupler 976 is inserted between directional coupler 901 and gain and phase adjuster 905 whereby a pilot signal may be introduced into the power amplifier path. The input signal delay path comprises delay 903. Cancellation circuit 915 cancels the signal component from the power amplifier path with the delayed input signal from the delay path so that the distortion component appears at the input of splitter 917. Amplitude and phase adjuster 922 modifies the distortion component from the cancellation circuit and applies the modified distortion component to directional coupler 927 via auxiliary amplifier 924. The amplifier output is obtained at lead 932 via directional coupler 930. As aforementioned, the pilot signal when introduced at directional coupler 976 appears at the output of cancellation circuit 915 as part of the distortion component not affected by the adjustment of gain and phase adjuster 905.

Controller 940 is substantially the same as controller 140 of FIG. 1 except that the instructions in control program store 305 are modified after carrier signal detection and adjustment to scan the prescribed frequency band from end $f_L$ in FIG. 7 to locate a frequency at which there is no signal and to insert a pilot signal at that frequency into directional coupler 976. The operations of controller 940 are illustrated in the flow charts of FIGS. 10 and 11. In order to generate a pilot signal, VCO 942 drives frequency shifter 972 which produces a signal at the detected frequency as is well known in the art. The inserted pilot then operates in place of the intermodulation signal described with respect to the flow charts of FIGS. 4 and 6. The operations of FIG. 10 with respect to carrier signal reduction through modification of the parameters of gain and phase adjuster 905 are substantially the same as in FIGS. 4 and 5. The operations of FIGS. 10 and 11 related to scanning for an unused frequency and adjusting the parameters of gain and phase adjuster 922, however, are different from the scanning for an intermodulation signal and adjustment of the distortion signal in FIGS. 4 and 6.

Figure 10:
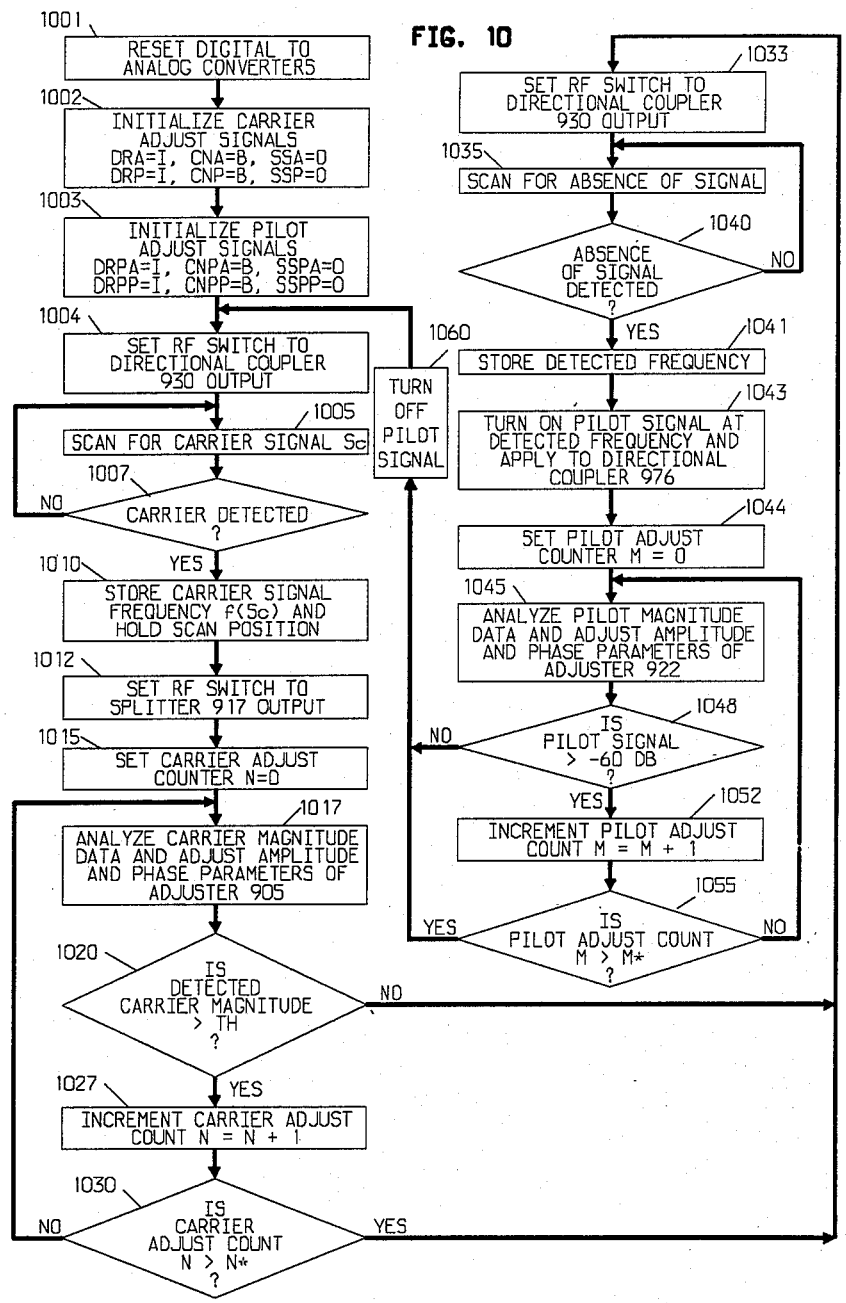
FIGS. 10 and 11 are flow charts illustrating the operation of the controller for the amplifier of FIG. 9.

With reference to FIGS. 3, 9 and 10, digital to analog converters 325, 330, 340 and 345 are initially reset in step 1001 and the carrier adjust signals DRA, CNA, SSA, DRP, CNP, and SSP and pilot adjust control signals DRPA, CNPA, SSPA, DRPA, CNPP and SSPP are initialized in steps 1002 and 1003. RF switch 937 is then set to couple the signal on lead 934 to mixer 942 (step 1004). In the loop from step 1005 to step 1007, the prescribed frequency band is scanned (step 1005) until a carrier signal is detected at lead 934 (step 1007). Signals obtained at narrow band receiver 950 during the scan are applied to analog to digital converter 301 in FIG. 3 and stored by the control processor in data store 315. Upon detection of a carrier signal by the control processor, the carrier signal amplitude and frequency are stored in the controller and the scan frequency of VCO 942 is maintained (step 1010).

Processor 310 sends a signal to RF Switch 937 to change its position and couple the uncancelled signal from splitter 917 to mixer 945 (step 1012). At this time, the signal corresponding to the detected carrier is applied from receiver 950 to analog to digital converter 301. A signal N which counts the number of carrier signal adjustments is then set to zero (step 1015) and the carrier signal adjustment loop from step 1017 to step 1030 is entered. During the iterative detected carrier signal adjustment, the parameters of amplitude and phase adjuster 905 are modified to minimize the carrier signal observed by the control processor. The loop is iterated until the carrier signal falls below a predetermined threshold or until a preset number of adjustments have been made.

In the carrier adjustment loop, the carrier signal at splitter 917 is applied to analog to digital converter 301 via RF switch 937, mixer 945 and narrow band receiver 950. The carrier magnitude data is analyzed and adjustments are made to the amplitude and phase parameters of adjuster 905 (step 1017). The magnitude of the carrier signal $M(S_c)$ is compared to the predetermined threshold in decision step (1020) by processor 310. Until the carrier magnitude is less than the threshold TH, the loop is iterated. In each iteration, the magnitude of the carrier signal from splitter 917 is compared to a threshold value (step 1020). If the magnitude of the carrier signal at splitter 917 is less than the threshold value, the carrier component in the output of cancellation circuit 915 in FIG. 9 is determined to be acceptable, control is passed to step 1033 and the intermodulation distortion reduction is started. Where the magnitude is equal to or greater than the threshold value TH, the carrier adjustment count is incremented (step 1027) and compared to a predetermined number N* (step 1030). If N* is exceeded, the iterations are terminated. The details of the operation of step 1017 are the same as set forth in FIG. 5 with respect to FIG. 1.

After the carrier adjust loop is exited, RF switch 937 is set to connect lead 934 to mixer 945 (step 1033) and the pilot signal operations are started in the loop including steps 1035 and 1040. In step 1035, the frequency band of the amplifier is scanned a narrow portion at a time. When the absence of a signal is detected (step 1040) by monitoring for output on lead 934 lower than any expected signal, the frequency at which only noise is obtained is stored (step 1041). A pilot signal is then turned on at the detected frequency and applied to directional coupler 976 (step 1043). The pilot adjust counter of controller 940 is set to zero (step 1044) and the pilot adjust loop from step 1045 to step 1055 is entered. In step 1045, the magnitude of the pilot at lead 934 is applied to controller 940 via RF switch 937, mixer 945 and narrow band receiver 950 and the amplitude and phase of adjuster 922 is modified to reduce the signal on lead 934. After each adjustment, the magnitude of the pilot is compared to the −60 db level (step 1048). If the pilot is less than −60 db, the pilot signal is turned off (step 1060) and controller 940 reenters step 1004 to restart the carrier search operations. Otherwise, the pilot adjust count is incremented (step 1052) and the count M is compared to the maximum count M* (step 1055). Until the M* count is reached or the pilot magnitude falls below −60 db, the pilot adjustment loop is reentered at step 1045.

Figure 11:
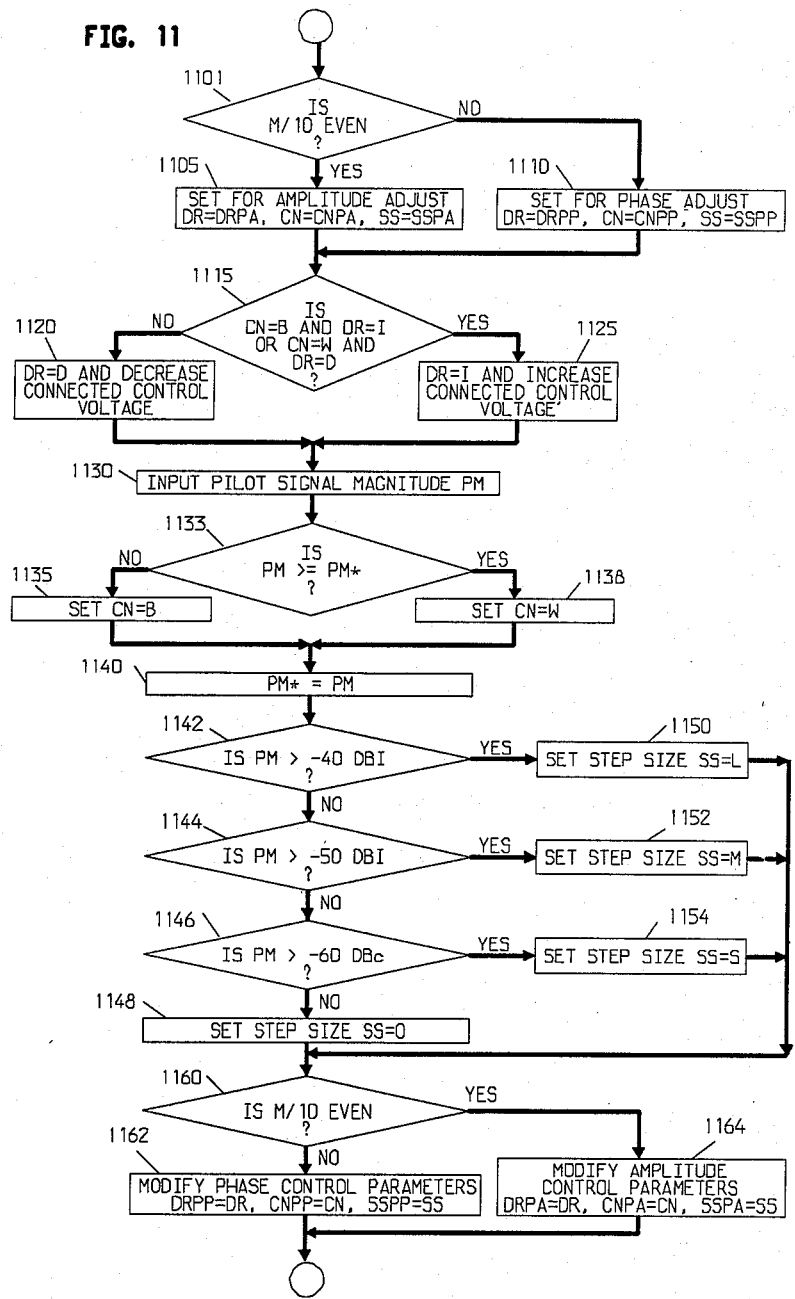

The pilot signal analysis and adjustment step 1045 is shown in greater detail in FIG. 11. Referring to FIG. 11, the analysis involves separate adjustment of the amplitude and phase parameters of adjuster 922. Decision step 1101 is entered from step 1043 or 1055 in FIG. 10 to determine whether the amplitude or the phase parameter is to be adjusted in the current iteration. As previously described, this is done by dividing the adjustment count signal M by 10. If the result is even, the control signals for the adjustments DR, CN, and SS are set to previous amplitude adjustment values DRPA, CNPA AND SSPA in step 1105. Otherwise the adjustment control signals DR, CN, and SS are set to previous phase adjustment values DRPP, CNPP AND SSPP in step 1110. Assume for purposes of illustration that amplitude adjustment is selected. The direction of change control signal DR is initially set to the value, i.e., I (increase) or D (decrease), obtained in the last iteration. The condition control signal is set to either B (better) or W (worse) corresponding the corrective value of the last iteration and the correction step size SS is set to a large value, medium value or small value corresponding to the last iteration.

Decision step 1115 is then entered wherein the control parameters are evaluated. If CN=B and DR=I or CN=W and DR=D indicating an improvement on increase or a worsening on decrease during the last iteration, control signal DR is set to I and the control voltage on amplitude adjustment digital to analog converter 340 is increased by an amount corresponding to the setting of step size signal SS (step 1125). In the event that the condition CN=B and DR=I or CN=W and DR=D is not satisfied, direction control DR is set to D and the control voltage on the amplitude adjustment converter is decreased by the amount corresponding to the last iteration step size SS (step 1120). In the initial iteration, the step size is preset to zero.

After the adjustment of step 1120 or step 1125, the pilot signal amplitude PM is input from receiver 950 of FIG. 9 (step 1130) and compared to the amplitude of the preceding iteration PM* (step 1133). If PM≧PM*, the adjustment status is worse and condition signal CN is set to W (step 1138). Where PM is smaller than PM*, the adjustment status is better and CN is set to B (step 1135). PM* is then set to the current magnitude value PM in step 1140 preparatory for the next iteration.

The range of the present magnitude signal PM is then determined in decision steps 1142, 1144 and 1146 so that the step size of the next iteration can be adjusted. If the magnitude of PM is greater than −40 db relative to the peak of the detected carrier the step size is set to a large value in step 1150 and the next adjustment provides a large correction. A magnitude of PM between −40 and −50 db causes the step size to be set to a medium value in step 1152 and a step size between −50 and −60 db generates a small step size in step 1154. If the magnitude of PM is less than −60 db, the step size is set to zero in step 1148. Since M/10 is even for amplitude adjustment, step 1164 is entered via decision step 1160 and the updated parameters DR, CN and SS stored as signals DRPA, CNPA and SSPA. If M/10 is odd, control parameters DR, CN and SS are stored as signals DRPP, CNPP and SSPP in step 1162. Processor control is then passed to step 1048 in FIG. 10.

Where the signal M/10 is odd, the operation of the control processor is the same as previously described with respect to FIG. 11 except that condition control signal CNPP, direction control signal DRPP and step size signal SSPP are obtained as indicated in step 1110 and used as control signals CN, DR and SS. Maximum adjustment count signal M* may be set to 10 so that the control processor adjusts one of the amplitude and phase parameters of adjuster 922 ten times and then adjusts the other of the amplitude and phase parameters 10 times or until the conditions of step 1048 are met.

When the data analysis and comparison of steps 1045 and 1048 are completed, pilot count M is incremented (step 1052) and the count is compared to the maximum allowable count M* in decision step 1055. If M is greater than M*, the pilot signal is turned off (step 1060) and step 1004 is reentered to begin the carrier signal search operations. Where M is equal to or less than M* in step 1055, the next iteration is then started in step 1045. The iterations are ended when the pilot signal is less than −60 db level set in decision step 1048 or the iterations time out in step 1055 because count signal M is greater than M*. As a result of the pilot reduction loop operation, the intermodulation distortion is reduced by readjusting the parameters of amplitude and phase adjuster 922 until an acceptable level of intermodulation distortion is obtained.

The invention has been described with reference to illustrative embodiments thereof. It is apparent, however, to one skilled in the art that various modifications and changes may be made without departing from the spirit and scope of the invention.

I claim:

1. A feed forward circuit comprising:
   means for receiving one or more modulated carrier signals in a prescribed frequency range;
   a first circuit path having an input connected to the receiving means and an output, the first circuit path including power amplifying means responsive to the one or more modulated carrier signals for generating an output signal having a distortion component;
   a second circuit path having an input connected to the receiving means and an output, the second circuit path including delay means for transferring the one or more modulated carrier signals without distortion;
   means for combining the power amplifying means output signal from the output of the first circuit path with the transferred one or more modulated carrier signals from the output of the second circuit path to form a signal representative of the distortion component of the first circuit path output signal; and
   means for subtracting the signal from the combining means from the output signal of the first circuit path to reduce the distortion component of the output signal of the first path;
   wherein the improvement comprises
   means for detecting one of the carrier signals from the combining means within the prescribed frequency range; and
   means responsive to the detected carrier signal for modifying the amplitude and phase of signals in the first circuit path to reduce the magnitude of the detected carrier signal in the distortion component representative signal.

2. A feed forward circuit comprising:
   means for receiving one or more input signals in a prescribed frequency range;
   a first circuit path having an input connected to the receiving means and an output, the first circuit path including power amplifying means responsive to the one or more input signals for generating an output signal having a distortion component;
   a second circuit path having an input connected to the receiving means and an output, the second circuit path including delay means for transferring the one or more input signals without distortion;
   means for combining the power amplifying means output signal from the output of the first circuit path with the transferred one or more input signals from the output of the second circuit path to form a signal representative of the distortion component of the first circuit path output signal; and
   means for subtracting the signal from the combining means from the output signal of the first circuit path to reduce the distortion component of the output signal of the first path;
   wherein the improvement comprises
   means for detecting a first type signal from the combining means within the prescribed frequency range; and
   means responsive to the detected first type signal from the combining means for adjusting the amplitude and phase of signals in the first circuit path to minimize the magnitude of the detected first type signal from the combining means.

3. A feed forward circuit according to claim 2 wherein the means for adjusting the amplitude and phase of signals in the first circuit path comprises means for determining the magnitude of the detected first type signal from the combining means and means responsive to the determined magnitude of the detected first type signal for sequentially changing the amplitude of signals in the first circuit path to reduce the magnitude of the first type signal from the combining means and changing the phase of signals in the first circuit path to reduce the determined magnitude of the first type signal from the combining means.

4. A feed forward circuit according to claim 3 wherein the means for detecting a first type signal in the prescribed frequency range comprises means for scanning the output of the subtracting means over the prescribed frequency range to detect a signal exceeding a first predetermined threshold.

5. A feed forward circuit according to claim 4 wherein the first type signal is a carrier signal.

6. A feed forward circuit according to claims 2, 3, 4 or 5 wherein the means for subtracting the signal from the combining means from the signal at the output of the first path having the distortion component includes means for modifying the amplitude and phase of the signal from the combining means; and
   further comprises:
   means connected to the output of the subtracting means for detecting a second type signal associated with the detected first type within the prescribed frequency range; and means responsive to the magnitude of the detected second type signal for adjusting the amplitude and phase of the signal from the combining means to reduce the magnitude of the detected second type signal at the output of the subtracting means.

7. A feed forward circuit according to claim 6 wherein the means for adjusting the amplitude and phase of the signal from the combining means comprises means for determining the magnitude of the detected second type signal from the subtracting means and means responsive to the determined magnitude of the detected second type signal for sequentially changing the amplitude of the signal from the combining means to reduce the magnitude of the detected second type signal from the subtracting means and changing the phase of the signal from the combining means to reduce the determined magnitude of the second type signal from the subtracting means.

8. A feed forward circuit according to claim 7 wherein the means for detecting the second type signal in the prescribed frequency range comprises means for scanning the output of the subtracting means over the prescribed frequency range to detect a signal having a magnitude between second and third predetermined thresholds.

9. A feed forward circuit according to claim 8 wherein the second type signal is an intermodulation products signal.

10. A feed forward circuit according to claim 2 wherein the means for subtracting the signal from the combining means from the signal at the output of the first path having the distortion component includes means for modifying the amplitude and phase of the signal from the combining means; and further comprises: means connected to the output of the subtracting means for detecting a frequency within the prescribed frequency range having no signal thereat above a predetermined threshold;

means responsive to the detection of said frequency for inserting a pilot signal at said detected frequency into the first circuit path; and means responsive to the magnitude of the inserted pilot signal at the output of the subtracting means for modifying the amplitude and phase of the output signal from the combining means to reduce the magnitude of the inserted pilot signal at the output of the subtracting means.

11. A feed forward circuit according to claim 10 wherein the means for adjusting the amplitude and phase of the signal from the combining means comprises means for determining the magnitude of the inserted pilot signal from the subtracting means and means responsive to the determined magnitude of the inserted pilot signal for sequentially changing the amplitude of the signal from the combining means to reduce the magnitude of the inserted pilot signal from the subtracting means and changing the phase of the signal from the combining means to reduce the magnitude of the inserted pilot signal from the subtracting means.

12. A feed forward circuit according to claim 11 wherein the means for detecting the frequency in the prescribed frequency range having no signal thereat above the predetermined threshold comprises means for scanning the output of the subtracting means over the prescribed frequency range to detect a signal having a magnitude below the predetermined threshold.

13. A feed forward circuit comprising:

means for receiving one or more input signals in a prescribed frequency range;

a first circuit path having an input connected to the receiving means and an output, the first circuit path including power amplifying means responsive to the input signal for generating an output signal having a distortion component;

a second circuit path having an input connected to the receiving means and an output, the second circuit path including delay means for transferring the input signal without distortion;

combining means having a first input connected to the output of the first circuit path, a second input connected to the output of the second circuit path and an output for combining the power amplifying means output signal from the output of the first circuit path with the transferred input signal from the output of the second circuit path to form a signal representative of the distortion component of the first circuit path output signal; and means for subtracting the signal at the output of the combining means from the first circuit path output signal to reduce the distortion component of the output signal from the first path;

wherein the improvement comprises means for detecting a frequency within the prescribed frequency range having no signal threat above a predetermined first threshold;

means responsive to the detection of said frequency for inserting a pilot signal at said detected frequency at the input signal receiving means; and means responsive to the magnitude of the pilot signal at the output of the combining means for adjusting the amplitude and phase of signals in the first circuit path to minimize the magnitude of the inserted pilot signal at the output of the combining means.

14. A feed forward circuit according to claim 13 wherein the means for adjusting the amplitude and phase of signals in the first circuit path comprises means for determining the magnitude of the inserted pilot signal at the output of the combining means and means responsive to the determined magnitude of the inserted pilot signal for sequentially changing the amplitude of signals in the first circuit path to reduce the magnitude of the inserted pilot signal at the output of the combining means and changing the phase of signals in the first circuit path to reduce the determined magnitude of the inserted pilot signal at the output of the combining means.

15. A feed forward circuit according to claim 14 wherein means for detecting the frequency within the prescribed frequency range having no signal thereat above a predetermined threshold comprises means for scanning the output of the subtracting means over the prescribed frequency range.

16. A feed forward circuit according to claim 13 wherein the means for subtracting the signal at the output of the combining means from the signal at the output of the first path having the distortion component includes means for modifying the amplitude and phase of the signal at the output of the combining means; and further comprises:

means connected to the output of the subtracting means for detecting an intermodulation products signal within the prescribed frequency range; and means responsive to the magnitude of the detected intermodulation product signal for adjusting the amplitude and phase of the signal at the output of the combining means to reduce the magnitude of the detected intermodulation product signal at the output of the subtracting means.

17. A feed forward circuit according to claim 16 wherein the means for adjusting the amplitude and phase of the signal at the output of the combining means comprises means for determining the magnitude of the detected intermodulation products signal from the subtracting means and means responsive to the determined magnitude of the detected intermodulation products signal for sequentially changing the amplitude of the signal at the output of the combining means to reduce the magnitude of the detected intermodulation signal from the subtracting means and changing the phase of the signal at the output of the combining means to reduce the determined magnitude of the intermodulation signal from the subtracting means.

18. A feed forward circuit according to claim 17 wherein the means for detecting the intermodulation products signal in the prescribed frequency range comprises means for scanning the output of the subtracting means over the prescribed frequency range to detect a signal having a magnitude between second and third predetermined thresholds.

19. A feed forward circuit comprising:
  means for receiving one or more input signals in a prescribed frequency range;
  a first circuit path having an input connected to the receiving means and an output, the first circuit path including power amplifying means responsive to the one or more input signals for generating an output signal having a distortion component;
  a second circuit path having an input connected to the receiving means and an output, the second circuit path including delay means for transferring the one or more input signals without distortion;
  means for combining the power amplifying means output signal from the output of the first circuit path with the transferred one or more input signals from the output of the second circuit path to form a signal representative of the distortion component of the first circuit path output signal; and
  means for subtracting the signal from the combining means from the output signal of the first circuit path to reduce the distortion component of the output signal of the first path including means for modifying the amplitude and phase of the signal from the combining means;
  wherein the improvement comprises
  means for detecting a first type signal from the combining means within the prescribed frequency range;
  means responsive to the detected first type signal for modifying the amplitude and phase of signals in the first circuit path to reduce the magnitude of the detected first type signal in the distortion component representative signal;
  means connected to the output of the subtracting means for detecting a second type signal associated with the detected first type signal within the prescribed frequency range; and
  means responsive to the magnitude of the detected second type signal for adjusting the amplitude and phase of the signal from the combining means to reduce the magnitude of the detected second type signal at the output of the subtracting means.

20. A feed forward circuit according to claim 19 wherein the means for adjusting the amplitude and phase of the signal from the combining means comprises means for determining the magnitude of the detected second type signal from the subtracting means and means responsive to the determined magnitude of the detected second type signal for sequentially changing the amplitude of the signal from the combining means to reduce the magnitude of the detected second type signal from the subtracting means and changing the phase of the signal from the combining means to reduce the determined magnitude of the detected second type signal from the subtracting means.

* * * * *